United States Patent
Chang et al.

(10) Patent No.: US 8,633,582 B2
(45) Date of Patent: Jan. 21, 2014

(54) CHIP PACKAGE AND FABRICATION METHOD THEREOF

(76) Inventors: Shu-Ming Chang, Taipei (TW); Cheng-Te Chou, Taipei (TW)

(*) Notice: Subject to any disclaimer, the term of this patent is extended or adjusted under 35 U.S.C. 154(b) by 521 days.

(21) Appl. No.: 12/702,482

(22) Filed: Feb. 9, 2010

(65) Prior Publication Data

US 2011/0042796 A1 Feb. 24, 2011

Related U.S. Application Data (60) Provisional application No. 61/235,567, filed on Aug. 20, 2009.

(51) Int. Cl.
*H01L 23/48* (2006.01)

(52) U.S. Cl.
USPC .......... 257/690; 257/684; 257/E23.068; 257/E21.508; 257/738; 438/106; 438/125; 438/613

(58) Field of Classification Search
USPC .......... 257/737, 690, E23.068, E21.502, 257/E21.508; 438/124–127
See application file for complete search history.

(56) References Cited

U.S. PATENT DOCUMENTS

| | | | | |
|---|---|---|---|---|
| 5,111,278 A * | 5/1992 | Eichelberger | ................. | 257/698 |
| 6,154,366 A * | 11/2000 | Ma et al. | ................. | 361/704 |
| 6,400,573 B1 * | 6/2002 | Mowatt et al. | ................. | 361/719 |
| 6,423,570 B1 * | 7/2002 | Ma et al. | ................. | 438/106 |
| 6,639,324 B1 * | 10/2003 | Chien | ................. | 257/778 |
| 6,680,529 B2 * | 1/2004 | Chen et al. | ................. | 257/700 |
| 6,765,299 B2 * | 7/2004 | Takahashi et al. | ................. | 257/777 |
| 6,847,066 B2 * | 1/2005 | Tahara et al. | ................. | 257/243 |
| 6,872,589 B2 * | 3/2005 | Strandberg et al. | ................. | 438/106 |
| 6,939,738 B2 * | 9/2005 | Nakatani et al. | ................. | 438/108 |
| 6,960,826 B2 * | 11/2005 | Ho et al. | ................. | 257/723 |
| 6,972,964 B2 * | 12/2005 | Ho et al. | ................. | 361/761 |
| 7,045,391 B2 * | 5/2006 | Lin | ................. | 438/109 |
| 7,045,899 B2 * | 5/2006 | Yamane et al. | ................. | 257/777 |
| 7,087,991 B2 * | 8/2006 | Chen et al. | ................. | 257/700 |
| 7,101,781 B2 * | 9/2006 | Ho et al. | ................. | 438/612 |
| 7,238,602 B2 * | 7/2007 | Yang | ................. | 438/613 |
| 7,262,081 B2 * | 8/2007 | Yang et al. | ................. | 438/109 |
| 7,453,148 B2 * | 11/2008 | Yang et al. | ................. | 257/734 |
| 7,511,376 B2 * | 3/2009 | Lin et al. | ................. | 257/734 |
| 7,514,335 B2 * | 4/2009 | Wakabayashi et al. | ................. | 438/411 |
| 7,618,886 B2 * | 11/2009 | Jobetto et al. | ................. | 438/613 |
| 7,655,502 B2 * | 2/2010 | Mangrum et al. | ................. | 438/106 |
| 7,662,667 B2 * | 2/2010 | Shen | ................. | 438/112 |
| 7,667,318 B2 * | 2/2010 | Yang et al. | ................. | 257/700 |

(Continued)

*Primary Examiner* — N Drew Richards
*Assistant Examiner* — Ankush Singal
(74) *Attorney, Agent, or Firm* — Birch, Stewart, Kolasch & Birch, LLP (57) ABSTRACT

A chip package is disclosed. The package includes a carrier substrate and at least one semiconductor chip thereon. The semiconductor chip has a plurality of conductive pads, where a plurality of first redistribution layers (RDLs) is disposed thereon and is electrically connected thereto. A single-layer insulating structure covers the carrier substrate and the semiconductor chip, having a plurality of openings exposing the plurality of first RDLs. A plurality of second RDLs is disposed on the single-layer insulating structure and is electrically connected to the plurality of first RDLs. A passivation layer is disposed on the single-layer insulating structure and the plurality of second RDLs, having a plurality of openings exposing the plurality of second RDLs. A plurality of conductive bumps is correspondingly disposed in the plurality of openings to be electrically connected to the plurality of second RDLs. A fabrication method of the chip package is also disclosed.

27 Claims, 6 Drawing Sheets

(56) References Cited

U.S. PATENT DOCUMENTS

| | | | |
|---|---|---|---|
| 7,727,803 B2* | 6/2010 | Yamagata | 438/107 |
| 7,737,543 B2* | 6/2010 | Jobetto et al. | 257/686 |
| 7,763,969 B2* | 7/2010 | Zeng et al. | 257/700 |
| 7,808,112 B2* | 10/2010 | Boon | 257/777 |
| 7,816,177 B2* | 10/2010 | Takeuchi et al. | 438/106 |
| 7,842,887 B2* | 11/2010 | Sakamoto et al. | 174/260 |
| 7,868,445 B2* | 1/2011 | Kohl et al. | 257/690 |
| 7,888,183 B2* | 2/2011 | Liu et al. | 438/122 |
| 7,911,065 B2* | 3/2011 | Suh | 257/777 |
| 7,973,398 B2* | 7/2011 | Hsu | 257/684 |
| 7,981,722 B2* | 7/2011 | Yamagata | 438/106 |
| 8,058,718 B2* | 11/2011 | Hsu et al. | 257/687 |
| 8,227,927 B2* | 7/2012 | Chen et al. | 257/797 |
| 2001/0018800 A1* | 9/2001 | Tzanavaras et al. | 29/847 |
| 2001/0038151 A1* | 11/2001 | Takahashi et al. | 257/778 |
| 2002/0127769 A1* | 9/2002 | Ma et al. | 438/106 |
| 2003/0122244 A1* | 7/2003 | Lin et al. | 257/700 |
| 2003/0134455 A1* | 7/2003 | Cheng et al. | 438/125 |
| 2004/0046254 A1* | 3/2004 | Lin et al. | 257/734 |
| 2004/0070064 A1* | 4/2004 | Yamane et al. | 257/686 |
| 2004/0195686 A1* | 10/2004 | Jobetto et al. | 257/734 |
| 2005/0186705 A1* | 8/2005 | Jackson et al. | 438/106 |
| 2005/0258547 A1* | 11/2005 | Terui | 257/777 |
| 2006/0087037 A1* | 4/2006 | Hsu | 257/738 |
| 2006/0231958 A1* | 10/2006 | Yang | 257/777 |
| 2007/0272994 A1* | 11/2007 | Huang et al. | 257/434 |
| 2008/0029895 A1* | 2/2008 | Hu et al. | 257/762 |
| 2008/0042271 A1* | 2/2008 | Dauksher et al. | 257/737 |
| 2008/0191297 A1* | 8/2008 | Yang et al. | 257/432 |
| 2008/0217761 A1* | 9/2008 | Yang et al. | 257/700 |
| 2008/0217762 A1* | 9/2008 | Wong et al. | 257/700 |
| 2008/0265413 A1* | 10/2008 | Chou et al. | 257/737 |
| 2009/0014543 A1* | 1/2009 | Yeo et al. | 235/492 |
| 2009/0091022 A1* | 4/2009 | Meyer et al. | 257/723 |
| 2009/0168380 A1* | 7/2009 | Hsu et al. | 361/761 |
| 2009/0200658 A1* | 8/2009 | Hsu et al. | 257/700 |
| 2009/0218687 A1* | 9/2009 | Chou et al. | 257/737 |
| 2009/0224402 A1* | 9/2009 | Do et al. | 257/738 |
| 2009/0230553 A1* | 9/2009 | Meyer et al. | 257/738 |
| 2010/0013077 A1* | 1/2010 | Shin | 257/690 |
| 2011/0057305 A1* | 3/2011 | Chia | 257/700 |

* cited by examiner

CHIP PACKAGE AND FABRICATION METHOD THEREOF

CROSS REFERENCE TO RELATED APPLICATIONS

This application claims the benefit of U.S. Provisional Application U.S. Provisional Application No. 61/235,567, filed Aug. 20, 2009, the entirety of which is incorporated by reference herein.

BACKGROUND OF THE INVENTION

1. Field of the Invention

The invention relates to a chip package and more particularly to a fan-out type chip package and a fabrication method thereof.

2. Description of the Related Art

As the demands of electronic or optoelectronic products such as digital cameras, camera phones, bar code readers, and monitors, are increased, semiconductor technology develops rapidly, such that there is a trend for miniaturization of the semiconductor chip size and the functionality of the semiconductor chip becomes complicated.

More than one semiconductor chip is typically placed in the same sealed package for performance demands, thereby improving operational stability. However, since this requires placing more input/output (I/O) pads on a smaller chip, the difficulty of semiconductor packaging is increased and thus the yield is reduced. In particular, for wafer level chip scale package (WLCSP) applications, bumps pitch and size of chip packages limit the number of I/O conductive pads on the surface of the semiconductor surface and thus the improvement of the semiconductor chip performance is degraded.

Accordingly, there is a need to develop a novel package structure without the problems mentioned above.

BRIEF SUMMARY OF THE INVENTION

A detailed description is given in the following embodiments with reference to the accompanying drawings. A chip package and a method for fabricating a chip package are provided. An embodiment of a chip package comprises a carrier substrate. At least one semiconductor chip is disposed on the carrier substrate, wherein the semiconductor chip comprises a plurality of conductive pads. A plurality of first redistribution layers is disposed on the semiconductor chip and is electrically connected to the plurality of conductive pads. A single-layer insulating structure is disposed on the carrier substrate, covers the semiconductor chip, and crosses the plurality of first redistribution layers, wherein the single-layer insulating structure has a plurality of first openings exposing the plurality of first redistribution layers. A plurality of second redistribution layers is disposed on the single-layer insulating structure and is electrically connected to the plurality of first redistribution layers through the plurality of first openings. A first passivation layer is disposed on the single-layer insulating structure and the plurality of second redistribution layers and has a plurality of second openings exposing the plurality of second redistribution layers. A plurality of conductive bumps is correspondingly disposed in the plurality of second openings and is electrically connected to the plurality of second redistribution layers.

An embodiment of a method for fabricating a chip package comprises providing at least one semiconductor chip on a carrier substrate, wherein the semiconductor chip comprises a plurality of conductive pads. A plurality of first redistribution layers is formed on the semiconductor chip to be electrically connected to the plurality of conductive pads. A single-layer insulating structure is formed on the carrier substrate to cover the semiconductor chip and cross the plurality of first redistribution layers. The single-layer insulating structure is defined to form a plurality of first openings exposing the plurality of first redistribution layers. A plurality of second redistribution layers is formed on the single-layer insulating structure, such that the plurality of second redistribution layers is electrically connected to the plurality of first redistribution layers through the plurality of first openings. A passivation layer is formed on the single-layer insulating structure to cover the plurality of second redistribution layers. The passivation layer is defined to form a plurality of second openings exposing the plurality of second redistribution layers. A plurality of conductive bumps is correspondingly formed in the plurality of second openings, such that the plurality of conductive bumps is electrically connected to the plurality of first redistribution layers through the plurality of second openings.

BRIEF DESCRIPTION OF DRAWINGS

The invention can be more fully understood by reading the subsequent detailed description and examples with references made to the accompanying drawings, wherein.

DETAILED DESCRIPTION OF INVENTION

The following description is of the fabrication and the purpose of the invention. It can be understood that this description is provided for the purpose of illustrating the fabrication and the use of the invention and should not be taken in a limited sense. In the drawings or disclosure, the same or similar elements are represented or labeled by the same or similar symbols. Moreover, the shapes or thicknesses of the elements shown in the drawings may be magnified for simplicity and convenience. Additionally, the elements not shown or described in the drawings or disclosure are common elements which are well known in the art.

Figure 1A:
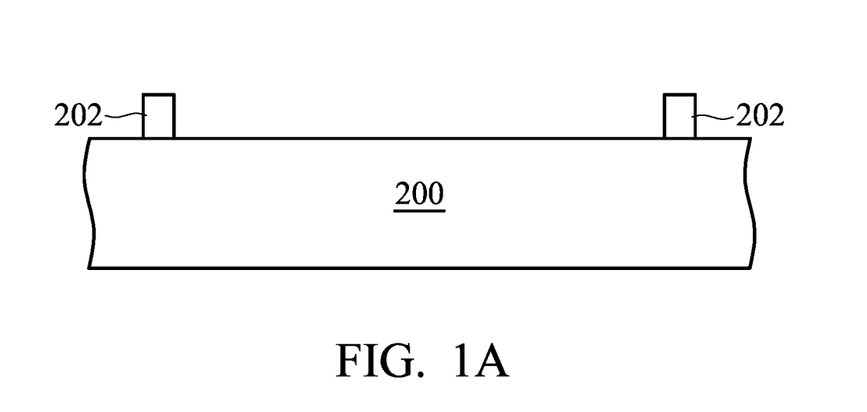
FIGS. 1A to 1G are cross sections of an exemplary embodiment of a method for fabricating a chip package according to the invention.
Figure 1B:
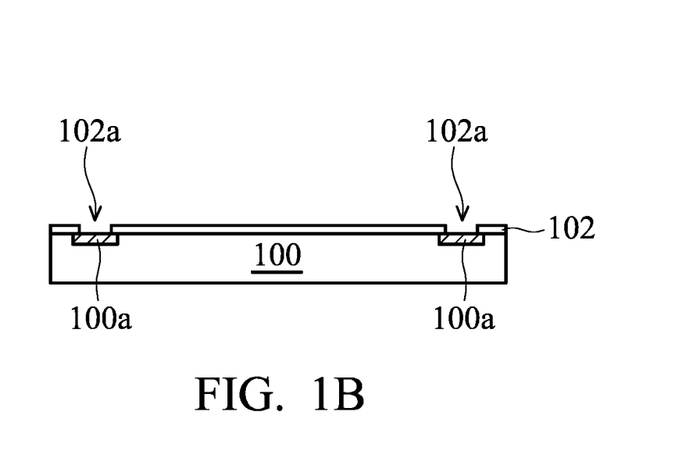
Figure 1C:
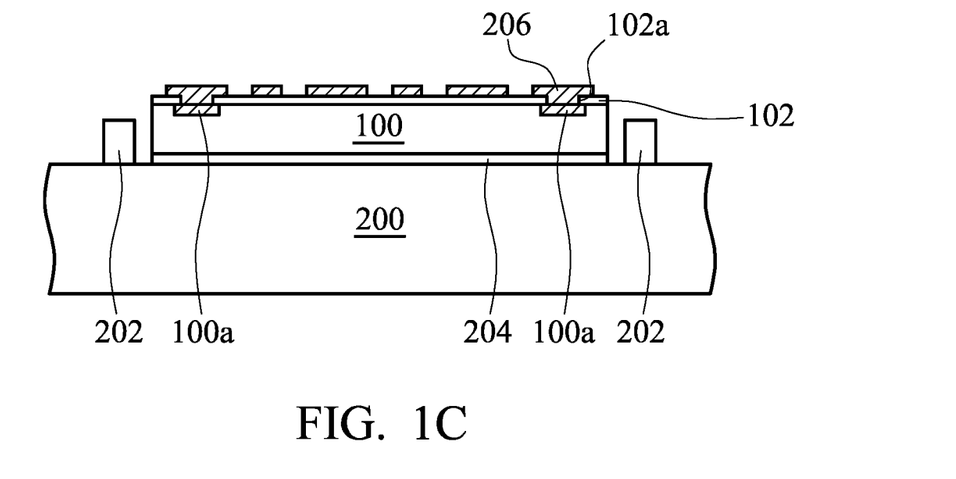
Figure 1D:
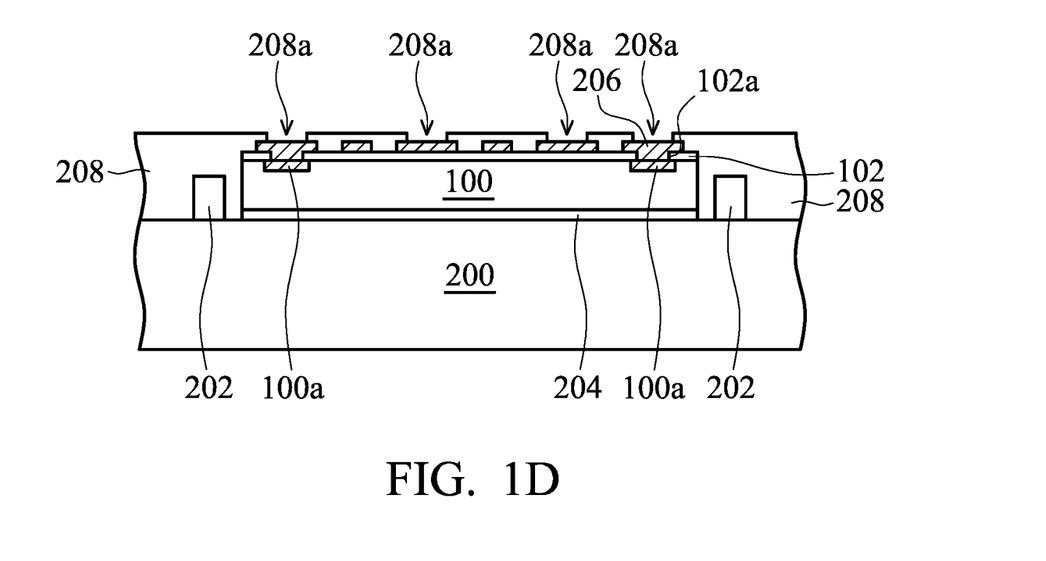
Figure 1E:
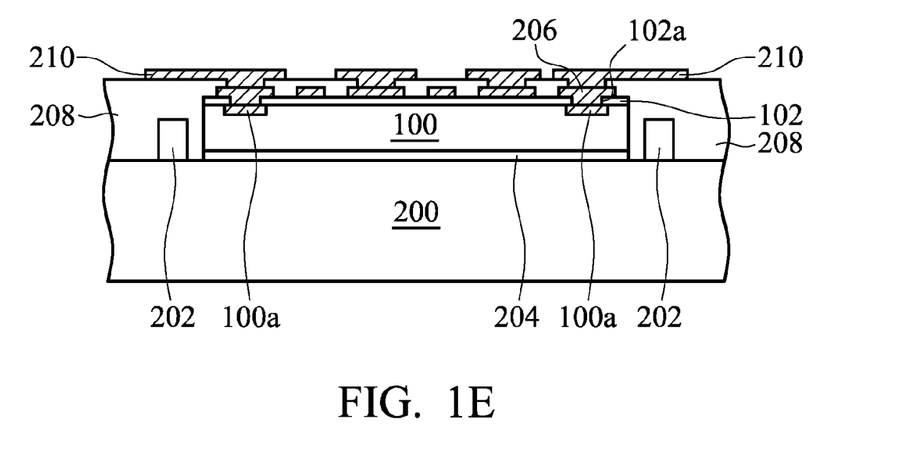
Figure 1F:
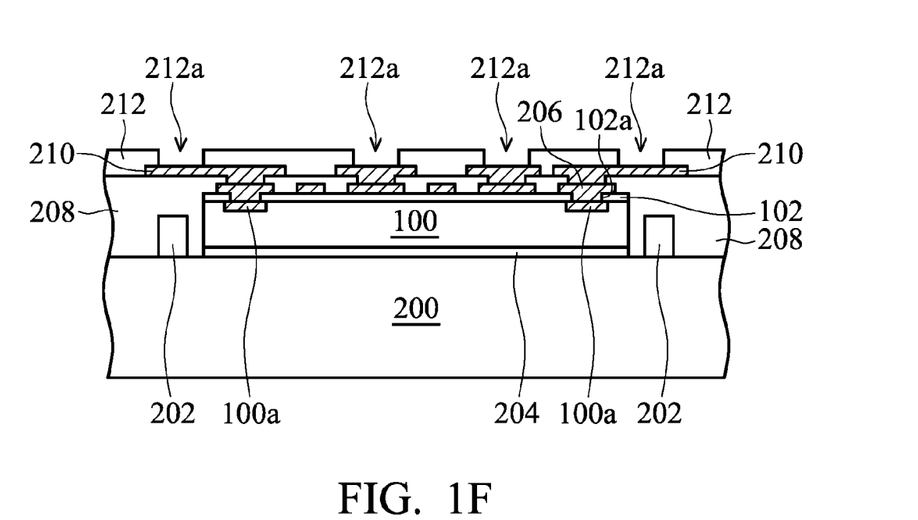
Figure 1G:
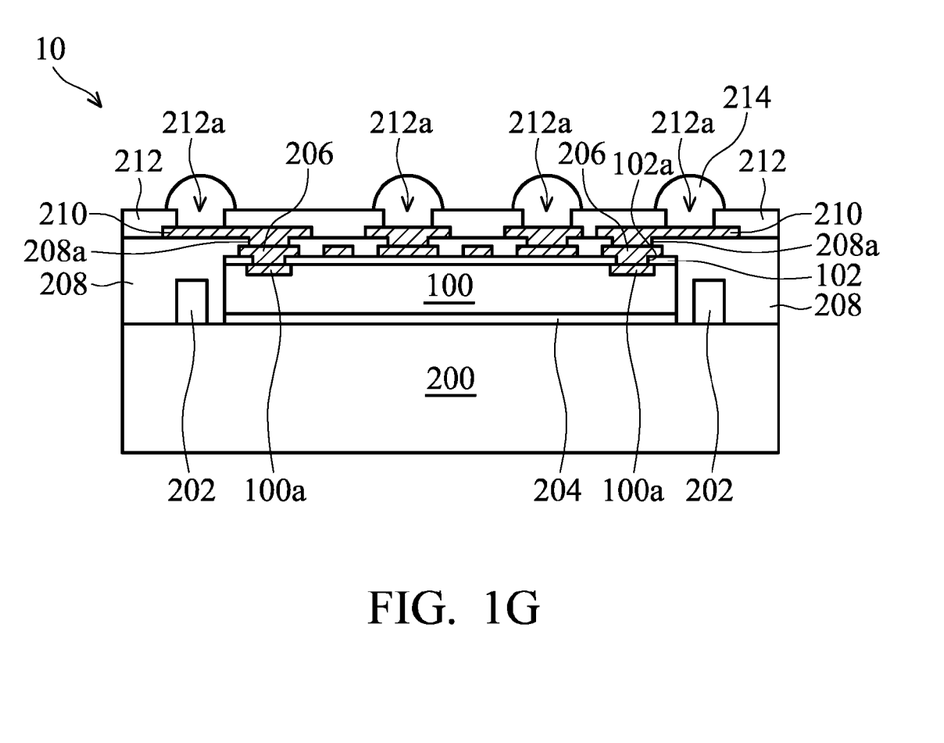

Referring to FIG. 1G, which is a cross section of an exemplary embodiment of chip package 10 according to the invention. In the embodiments, the chip package may be applied in various electronic components including active or passive elements, digital or analog integrated circuits, such as optoelectronic devices, micro electro mechanical systems (MEMS), micro fluidic systems, and physical sensors for detecting physical characteristics such as detecting heat, light, or pressure. In particular, a wafer scale package (WSP) process may be performed to package semiconductor chips which include image sensor devices, light-emitting diodes (LEDs), solar cells, RF circuits, accelerators, gyroscopes, micro actuators, surface acoustic wave devices, pressure sensors, and ink printer heads.

Wafer scale package processes involving electronic devices are first packaged at the wafer level and then diced into individual packages. However, in a specific embodiment, separate semiconductor chips may be, for example, redistributed on a carrier wafer for a subsequent packaging process, which may be called a wafer level package process. In addition, a stacking process may also be used in the wafer level package process mentioned above to stack a plurality of wafers having integrated circuits to form electronic device packages of multi-layered integrated circuit devices.

The chip package comprises a carrier substrate 200 and at least one semiconductor chip 100 that is disposed on the carrier substrate 200 through an adhesion layer 204. The carrier substrate 100, for example, can be provided by dicing a raw silicon wafer or other semiconductor substrate without including any circuits. Here, only a single semiconductor chip 100 is depicted for simplicity. In the embodiment, a skidproof structure 202 is disposed on the carrier substrate 200 and adjacent to the semiconductor chip 100 to serve as a shifting stopper for the chip. Moreover, the semiconductor chip 100 has a chip passivation layer (not shown) comprising a plurality of openings to expose a plurality of conductive pads 100a that is used for electrical connection between the circuits (not shown) of the semiconductor chip 100 and external circuits (not shown). Here, only two conductive pads 100a that are not adjacent to each other are depicted for simplicity. In one embodiment, two adjacent conductive pads have a space of about 15 µm to 25 µm.

In another embodiment, an additional passivation layer 102 may be formed on the chip passivation layer of the semiconductor chip 100 to redefine the plurality of openings 102a exposing the plurality of conductive pads 100a, thereby adjusting the shape and the size of the openings in the chip passivation layer to meet the specification demands in the wafer level package process of the embodiment. For example, the additional passivation layer 102 may comprise silicon oxide, silicon nitride, or a combination thereof. It may also be comprised of a polymer, such as polyimide, or butylcyclobutene (BCB, provided by Dow Chemical). The plurality of openings 102a may partially and correspondingly expose the plurality of conductive pads 100a thereunder, but has a size smaller than that in the chip passivation layer.

A plurality of fan-in type redistribution layers 206 is disposed on the semiconductor chip 100 and is electrically connected to the plurality of corresponding conductive pads 100a through the plurality of openings 102a in the passivation layer 102.

A single-layer insulating structure 208 is disposed on the carrier substrate 200 to cover the semiconductor chip 100, the skidproof structure 202 and cross the plurality of redistribution layers 206, in which the single-layer insulating structure 208 has a plurality of openings 208a that partially exposes the plurality of corresponding redistribution layers 206 thereunder. A plurality of redistribution layers 210 is disposed on the single-layer insulating structure 208 and is electrically connected to the plurality of corresponding redistribution layers 206 through the plurality of openings 208a in the single-layer insulating structure 208. Unlike the plurality of fan-in type redistribution layers 206, the plurality of redistribution layers 210 further extends on the single-layer insulating structure 208 outside of the semiconductor chip 100 to form a fan-out type structure.

A passivation layer 212, such as a solder mask, is disposed on the single-layer insulating structure 208 and on the plurality of redistribution layers 210, in which the passivation layer 212 has a plurality of openings 212a partially exposing the plurality of corresponding redistribution layers 210 thereunder. A plurality of conductive bumps 214 is correspondingly disposed in the plurality of openings 212a in the passivation layer 212 so as to be electrically connected to the plurality of corresponding redistribution layers 210.

Referring to FIGS. 1A to 1G, which illustrate an exemplary embodiment of a method for fabricating chip package 10 according to the invention. In FIG. 1A, a carrier substrate 100, such as a raw silicon wafer or other semiconductor substrate without including circuits, is provided. The carrier substrate 100 has a plurality of chip carried regions (not shown) to correspondingly place a plurality of semiconductor chips. A plurality of skidproof structures is correspondingly disposed on the carrier substrate 200 adjacent to the plurality of chip carried regions. Here, only a chip carried region and an adjacent skidproof structure 202 are depicted for simplicity. The skidproof structure 202 may comprise metal or insulating material, in which the former can be formed by electroplating and the latter can be formed by lithography or other deposition well known in the art.

Figure 2A:
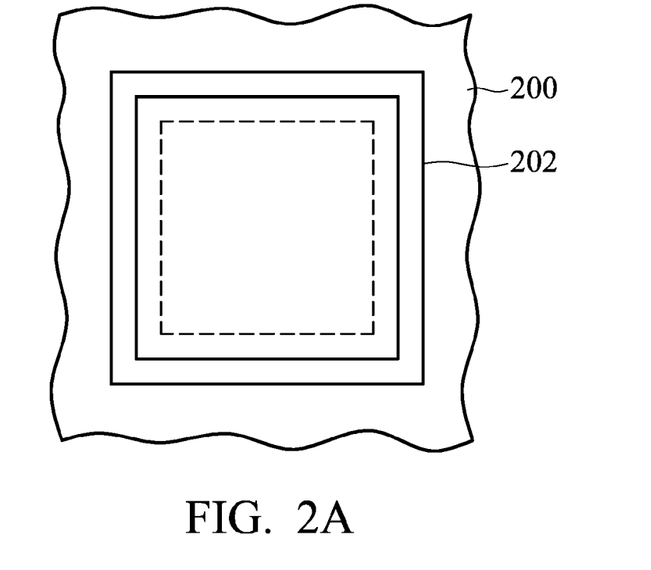
FIGS. 2A to 2C are plan views of various exemplary embodiments of a skidproof structure according to the invention.
Figure 2B:
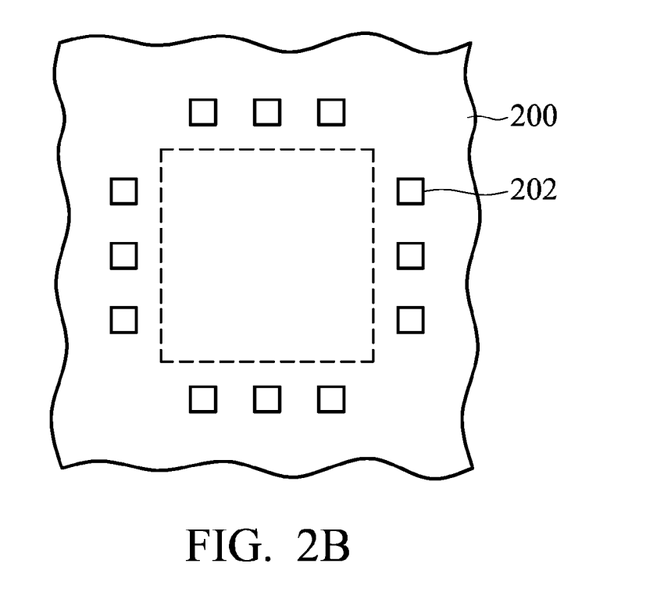
Figure 2C:
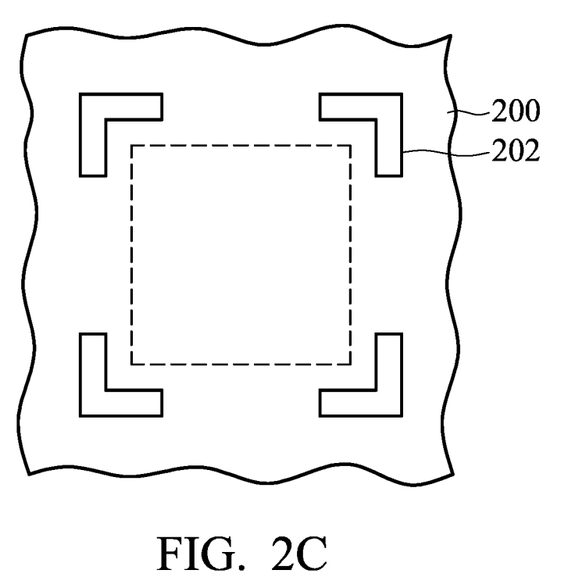

FIGS. 2A to 2C illustrate various exemplary embodiments of a position structure according to the invention. Elements in FIGS. 2A to 2C that are the same as those in FIG. 1A are labeled with the same reference numbers as in FIG. 1A and are not described again for brevity. In one embodiment, the skidproof structure 202 may be a ring surrounding the chip carried region (as indicated by the dash region), serving as an alignment mark for a chip and/or a chip shifting stopper during the performance of the subsequent semiconductor chip bonding process, as shown in FIG. 2A. In another embodiment, the skidproof structure 202 may comprise a plurality of islands surrounding the chip carried region, in which the skidproof structure 202 may comprise at least two islands which are adjacent to at least two opposite sides or adjacent sides of the chip carried region, respectively. For example, the plurality of islands of the skidproof structure 202 are rectangular when viewed from the top and are adjacent to all edges of the chip carried region, as shown in FIG. 2B. In yet another embodiment, the skidproof structure 202 may comprise at least two islands adjacent to at least two opposite corners of the corresponding chip carried region, respectively. For example, the skidproof structure 202 comprises islands that are L-shaped when viewed from the top, these islands are adjacent to the four corners of the chip carried region, respectively, as shown in FIG. 2C.

Next, a plurality of semiconductor chips is provided so as to be placed on the corresponding chip carried region of the carrier substrate 200. Here, only a semiconductor chip 100 is depicted for simplicity, as shown in FIG. 1B. The semiconductor chip 100 is covered by a chip passivation layer (not shown) having a plurality of openings exposing a plurality of conductive pads 100a that is used for electrical connection between the integrated circuits (not shown) of the semiconductor chip 100 and external circuits (not shown). Here, only two conductive pads 100a that are not adjacent to each other are depicted for simplicity. In one embodiment, two adjacent conductive pads are separated by a space of about 15 µm to 25 µm.

In one embodiment, an additional step of redefining openings can be performed. For example, the semiconductor chip 100 may be covered by an additional passivation layer 102, such as silicon oxide, silicon nitride, or a combination thereof or polymer, such as polyimide, or butylcyclobutene (BCB, provided by Dow Chemical). Next, a plurality of openings 102a is formed in the passivation layer 102 to partially expose the plurality of conductive pads 100a thereunder. In the embodiment, the shape and the size of the openings can be matched with the specification in the wafer level package process. For example, the size reduction of the openings in the chip passivation layer and space expansion between two adjacent openings is accomplished by adjusting the shape and the size of the openings 102a.

Referring to FIG. 1C, the semiconductor chip 100 is disposed on the chip carrier region (as indicated by the dash region shown in FIG. 2A, 2B, or 2C) of the carrier substrate 200 by an adhesion layer 204 using the skidproof structure 202 as an alignment mark. Such an adhesion layer may cause chip shift before the adhesion layer is cured, resulting in misalignment of chip in subsequent processes. Therefore, a skidproof structure surrounding the chip, such as a skidproof structure 202, is formed adjacent to or slightly contacts the semiconductor chip 100, such that flowage of the adhesion material is limited by the chip 100 and the skidproof structure 202, and therefore the chip shift is controlled within an allowable tolerance. In another embodiment, the chip 100 can be precisely disposed on the carrier substrate using the skidproof structure 202 as an alignment mark. In the embodiment, the adhesion layer 204 may comprise conductive silver paste, die attach film (DAF), or epoxy. Next, a plurality of redistribution layers 206 is formed on the passivation layer 102, in which the plurality of redistribution layers 206 is electrically connected to the plurality of corresponding conductive pads 100a through the plurality of openings 102a in the passivation layer 102. The plurality of redistribution layers 206 may comprise aluminum, copper, or other wire materials well known in the art and be formed by conventional deposition, such as electroplating, electroless plating, or physical vapor deposition (PVD). In the embodiment, the plurality of redistribution layers 206 is formed on the semiconductor chip 100 after the semiconductor chip 100 is placed on the carrier substrate 200. In another embodiment, the plurality of redistribution layers 206 may be formed on the semiconductor chip 100 before the semiconductor chip 100 is placed on the carrier substrate 200. In one embodiment, the plurality of redistribution layers 206 may not extend outside of the chip 100.

Referring to FIG. 1D, a single-layer insulating structure 208 is formed on the carrier substrate 200 to cover the semiconductor chip 100. The single-layer insulating structure 208 may comprise epoxy, polyimide, or butylcyclobutene (BCB, provided by Dow Chemical) and be formed by, for example, conventional bonding or coating process. Next, a plurality of openings 208a is formed in the single-layer insulating structure 208 by conventional lithography and etching processes, so as to partially expose the plurality of corresponding redistribution layers 206 thereunder.

Referring to FIG. 1E, a plurality of fan-out type redistribution layers 210 is formed on the single-layer insulating structure 208 and is electrically connected to the plurality of corresponding redistribution layers 206 through the plurality of openings 208a in the single-layer insulating structure 208. The plurality of redistribution layers 210 may also comprise aluminum, copper, or other wire materials well known in the art, and be formed by conventional deposition, such as electroplating, electroless plating, or PVD. Moreover, the plurality of redistribution layers 210 may outwardly extend on the single-layer insulating structure 208 outside of the semiconductor chip 100.

Referring to FIG. 1F, a passivation layer 212, such as a solder mask, is formed on the single-layer insulating structure 208 and covers the plurality of redistribution layers 210. Next, a plurality of openings 212a is formed in the passivation layer 212 by conventional lithography and etching processes, so as to partially expose the plurality of corresponding redistribution layers 210 thereunder.

Referring to FIG. 1G, a plurality of conductive bumps 214 is correspondingly formed in the plurality of openings 212a in the passivation layer 212, such that the plurality of conductive bumps 214 is electrically connected to the plurality of corresponding redistribution layers t210 through the plurality of openings 212a. Thereafter, the carrier substrate 200, which is composed of a silicon wafer, and the overlying single-layer insulating structure 208 are diced to form individual chip packages 10.

According to one of the foregoing embodiments, since the semiconductor chip 100 is disposed on the carrier substrate 200, the plurality of conductive bumps 214 may be formed above the carrier substrate 200 and outside of the semiconductor chip 100 through the plurality of fan-out type redistribution layers 210 except that the plurality of conductive bumps 214 is disposed directly above the semiconductor chip 100. Namely, the terminal contact regions of the chip package 10 (i.e. the locations of the plurality of conductive bumps 214) are not limited to the region directly above the semiconductor chip 100, and thus the number of the terminal contact regions can be increased, thereby meeting the package demands of high performance chips. In another embodiment, as the semiconductor chip 100 is mounted onto the carrier substrate 200, the chip shift is effectively controlled by the skidproof structure 202 surrounding the semiconductor chip 100 and on the carrier substrate 200, thereby maintaining or improving the yield of chip packages. Additionally, in yet another embodiment, the single-layer insulating structure 208 may be used as a fill material between two semiconductor chips 100 and simultaneously act as a passivation layer for covering the plurality of redistribution layers 206, thereby simplifying the fabrication and reducing the fabrication cost.

While the invention has been described by way of example and in terms of preferred embodiment, it is to be understood that the invention is not limited thereto. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A chip package, comprising:
  a carrier substrate;
  at least one semiconductor chip disposed above the carrier substrate, wherein the semiconductor chip comprises a plurality of conductive pads;
  a plurality of first redistribution layers disposed on the semiconductor chip and electrically connected to the plurality of conductive pads;
  a single-layer insulating structure disposed on and in direct contact with the carrier substrate, covering the semiconductor chip, and crossing the plurality of first redistribution layers, wherein the single-layer insulating structure has a plurality of first openings exposing the plurality of first redistribution layers;
  a plurality of second redistribution layers disposed on the single-layer insulating structure and electrically connected to the plurality of first redistribution layers through the plurality of first openings;
  a first passivation layer disposed on the single-layer insulating structure and the plurality of second redistribution layers and having a plurality of second openings exposing the plurality of second redistribution layers; and
  a plurality of conductive bumps correspondingly disposed in the plurality of second openings and electrically connected to the plurality of second redistribution layers.

2. The chip package of claim 1, further comprising a skidproof structure disposed on the carrier substrate and surrounding the semiconductor chip.

3. The chip package of claim 1, wherein the carrier substrate is a raw silicon substrate.

4. The chip package of claim 1, wherein the single-layer insulating structure comprises epoxy, polyimide, or butylcyclobutene.

5. The chip package of claim 2, wherein the skidproof structure comprises at least two islands adjacent to or contacting at least two opposite corners, opposite sides or adjacent sides of the semiconductor chip.

6. The chip package of claim 2, wherein the skidproof structure comprises metal or insulating material.

7. The chip package of claim 5, wherein the islands of the skidproof structure are L-shaped as viewed from top view perspective and adjacent to the corners of the semiconductor chip.

8. The chip package of claim 6, wherein the plurality of first redistribution layers is configured as a fan-in type redistribution layer and the plurality of second redistribution layers is configured as a fan-out type redistribution layer.

9. The chip package of claim 8, further comprising a second passivation layer disposed between the semiconductor chip and the plurality of first redistribution layers, wherein the second passivation layer comprises a plurality of third openings exposing the plurality of conductive pads, and the plurality of first redistribution layers is electrically connected to the plurality of conductive pads through the plurality of third openings.

10. A method for fabricating a chip package, comprising:
providing at least one semiconductor chip above a carrier substrate, wherein the semiconductor chip comprises a plurality of conductive pads;
forming a plurality of first redistribution layers on the semiconductor chip to be electrically connected to the plurality of conductive pads;
forming a single-layer insulating structure on and in direct contact with the carrier substrate to cover the semiconductor chip and cross the plurality of first redistribution layers;
defining the single-layer insulating structure to form a plurality of first openings exposing the plurality of first redistribution layers;
forming a plurality of second redistribution layers on the single-layer insulating structure, such that the plurality of second redistribution layers is electrically connected to the plurality of first redistribution layers through the plurality of first openings;
forming a first passivation layer on the single-layer insulating structure to cover the plurality of second redistribution layers;
defining the first passivation layer to form a plurality of second openings exposing the plurality of second redistribution layers; and
correspondingly forming a plurality of conductive bumps in the plurality of second openings, such that the plurality of conductive bumps is electrically connected to the plurality of first redistribution layers through the plurality of second openings.

11. The method of claim 10, further forming a skidproof structure on the carrier substrate, wherein the skidproof structure surrounds the semiconductor chip.

12. The method of claim 10, wherein the carrier substrate is a raw silicon substrate.

13. The method of claim 10, wherein the single-layer insulating structure comprises epoxy, polyimide, or butylcyclobutene.

14. The method of claim 11, wherein the skidproof structure comprises at least two islands adjacent to or contacting at least two opposite corners, opposite sides or adjacent sides of the semiconductor chip.

15. The method of one of claims 11, wherein the skidproof structure comprises metal or insulating material.

16. The method of claim 14, wherein the islands of the skidproof structure are L-shaped as viewed from top view perspective and adjacent to the corners of the semiconductor chip.

17. The method of claim 15, wherein the plurality of first redistribution layers is configured as a fan-in type redistribution layer and the plurality of second redistribution layers is configured as a fan-out type redistribution layer.

18. The method of claim 17, further comprising:
forming a second passivation layer between the semiconductor chip and the plurality of first redistribution layers; and
defining the second passivation layer to form a plurality of third openings exposing the plurality of conductive pads, wherein the plurality of first redistribution layers is electrically connected to the plurality of conductive pads through the plurality of third openings.

19. The method of claim 18, wherein the plurality of first redistribution layers is formed on the semiconductor chip before the semiconductor chip is provided on the carrier substrate.

20. A chip package, comprising:
a carrier substrate;
at least one semiconductor chip disposed on the carrier substrate, wherein the semiconductor chip comprises a plurality of conductive pads;
a plurality of first redistribution layers disposed on and in direct contact with the semiconductor chip and electrically connected to the plurality of conductive pads;
an insulating structure disposed on the carrier substrate, covering the semiconductor chip, and crossing the plurality of first redistribution layers, wherein the insulating structure has a plurality of first openings exposing the plurality of first redistribution layers;
a plurality of second redistribution layers disposed on the insulating structure and electrically connected to the plurality of first redistribution layers through the plurality of first openings;
a first passivation layer disposed on the insulating structure and the plurality of second redistribution layers and having a plurality of second openings exposing the plurality of second redistribution layers;
a plurality of conductive bumps correspondingly disposed in the plurality of second openings and electrically connected to the plurality of second redistribution layers; and
a skidproof structure disposed on the carrier substrate and surrounding the semiconductor chip.

21. The chip package of claim 20, wherein the skidproof structure comprises at least two islands adjacent to or contacting at least two opposite corners, opposite sides or adjacent sides of the semiconductor chip.

22. The chip package of claim 20, wherein the skidproof structure comprises metal or insulating material.

23. The chip package of claim 21, wherein the islands of the skidproof structure are L-shaped as viewed from top view perspective and adjacent to the corners of the semiconductor chip.

24. A method for fabricating a chip package, comprising:
providing at least one semiconductor chip on a carrier substrate, wherein the semiconductor chip comprises a plurality of conductive pads;
forming a plurality of first redistribution layers on the semiconductor chip to be electrically connected to the plurality of conductive pads;

forming an insulating structure on and in direct contact with the carrier substrate to cover the semiconductor chip and cross the plurality of first redistribution layers;

defining the insulating structure to form a plurality of first openings exposing the plurality of first redistribution layers;

forming a plurality of second redistribution layers on the insulating structure, such that the plurality of second redistribution layers is electrically connected to the plurality of first redistribution layers through the plurality of first openings;

forming a first passivation layer on the insulating structure to cover the plurality of second redistribution layers;

defining the first passivation layer to form a plurality of second openings exposing the plurality of second redistribution layers;

correspondingly forming a plurality of conductive bumps in the plurality of second openings, such that the plurality of conductive bumps is electrically connected to the plurality of first redistribution layers through the plurality of second openings; and forming a skidproof structure on the carrier substrate, wherein the skidproof structure surrounds the semiconductor chip.

25. The method of claim 24, wherein the skidproof structure comprises at least two islands adjacent to or contacting at least two opposite corners, opposite sides or adjacent sides of the semiconductor chip.

26. The method of one of claims 24, wherein the skidproof structure comprises metal or insulating material.

27. The method of claim 25, wherein the islands of the skidproof structure are L-shaped as viewed from top view perspective and adjacent to the corners of the semiconductor chip.

* * * * *